United States Patent [19]
Sawada et al.

[11] Patent Number: 5,652,425
[45] Date of Patent: Jul. 29, 1997

[54] PHOTOELECTRIC CONVERSION MODULE WITH NOISE COMPENSATION

[75] Inventors: Sosaku Sawada; Takeshi Sekiguchi; Nobuo Shiga, all of Yokohama, Japan

[73] Assignee: Sumitomo Electric Industries, Ltd., Osaka, Japan

[21] Appl. No.: 555,641

[22] Filed: Nov. 8, 1995

[30] Foreign Application Priority Data

Nov. 8, 1994 [JP] Japan .................. 6-273555

[51] Int. Cl.$^6$ .................................. H01J 40/14
[52] U.S. Cl. .................. 250/214 A; 250/214 C; 367/901
[58] Field of Search ............ 250/214 A, 214 C, 250/214 R, 239; 367/901

[56] References Cited

U.S. PATENT DOCUMENTS

| | | | |
|---|---|---|---|
| 3,655,987 | 4/1972 | Hinds | 250/214 R |
| 4,139,767 | 2/1979 | Witkowicz | 250/214 A |
| 4,902,886 | 2/1990 | Smisko | 250/214 R |
| 4,959,535 | 9/1990 | Garrett | 250/214 A |

FOREIGN PATENT DOCUMENTS

| | | |
|---|---|---|
| 60-84751 | 5/1985 | Japan . |
| 1-156631 | 6/1989 | Japan . |

*Primary Examiner*—Edward P. Westin
*Assistant Examiner*—Kevin Pyo
*Attorney, Agent, or Firm*—Cushman Darby & Cushman, IP Group of Pillsbury Madison & Sutro, LLP

[57] ABSTRACT

It is an object of present invention to provide a low-cost photoelectric conversion module in which a signal for compensating noise caused by changes in temperature and variations in power supply is obtained. In the photoelectric conversion module according to the present invention, a first amplifier having an input terminal connected to the anode of a light-receiving element for converting an optical signal into an electrical signal amplifies the electrical signal to obtain an amplified signal. A second amplifier having an input terminal connected to one electrode of a capacitor outputs an amplified signal for compensating noise of the electrical signal amplified by the first amplifier. The other electrode of the capacitor is connected to the cathode of the light-receiving element. The capacitor has a capacitance value equal to the capacitance of the light-receiving element.

13 Claims, 6 Drawing Sheets

PHOTOELECTRIC CONVERSION MODULE WITH NOISE COMPENSATION

BACKGROUND OF THE INVENTION

1. Field of the Invention

The present invention relates to a photoelectric conversion module for converting an optical signal into an electrical signal and, more particularly, to a photoelectric conversion module which can be mounted on an optical module as a transmission/reception device for an optical communication system, or the like.

2. Related Background Art

As a conventional photoelectric conversion module of this type, there is a photoelectric conversion module in which a photodiode (PD) as a light-receiving element, and a preamplifier for amplifying an electrical output from this photodiode are mounted on a TO package. An output from this photoelectric conversion module, i.e., an output (amplified electrical signal) from this preamplifier is compared with a fixed bias by an external comparator. Only a signal component from which a noise component is removed is electrically extracted.

SUMMARY OF THE INVENTION

Noise caused by changes in external temperature and variations in power supply voltage tends to be superposed on an output from the preamplifier mounted on the TO package. According to the present invention, to remove the influence of noise from an output electrical signal amplified by the preamplifier, a noise compensation output including a component identical with the noise component is obtained at the same time when an electrical output is supplied from the preamplifier. The obtained two types of electrical outputs (the noise compensation output, and the electrical output from the preamplifier) are input to a differential amplifier arranged on the input side of the comparator to cancel noise superposed on the electrical output from the preamplifier. With this arrangement, only a signal component from which noise caused by changes in temperature and variations in power supply voltage is removed can be extracted. In manufacturing a photoelectric conversion module with such a noise compensation output, the manufacturing cost, quality, and the like must be sufficiently taken into consideration so as to put the photoelectric conversion module into practical use.

More specifically, as shown in FIGS. 1 and 4, in a photoelectric conversion module according to the present invention, a plurality of circuit constituent elements are mounted on a package base 10 (TO package) having a conductive base 31. This conductive base 31 has a plurality of through holes 32 to 35 extending from a first surface 31a of the conductive base 31 to a second surface 31b opposite to the first surface. A light-receiving element 1 for converting an optical signal into an electrical signal, the light-receiving element 1 having a cathode 1a set at a predetermined potential ($V_{PD}$), and an anode 1b electrically connected to the conductive base 31; a preamplifier 4 (first amplifier) having an input terminal 4a electrically connected to the anode 1b of the light-receiving element 1; an equivalent capacitor 5 having a first electrode 5a electrically connected to the cathode 1a of the light-receiving element 1, the capacitor 5 having a capacitance value substantially equal to a capacitance of the light-receiving element 1; and a dummy preamplifier 6 (second amplifier) having the same circuit arrangement as that of the preamplifier 4, the dummy preamplifier 6 having an input terminal 6a electrically connected to a second electrode 5b of the equivalent capacitor 5 are arranged on the first surface of the conductive base 31.

The photoelectric conversion module according to the present invention comprises five lead pins 36 to 40 extending outside the module from the second surface side of the conductive base 31 of the TO package 10. In particular, the first lead pin 36 extends through the through hole 32 of the conductive base 31 from the second surface 31b side of the conductive base 31 to the first surface 31a side without being brought into contact with the conductive base 31. The distal end of the first lead pin 36 is electrically connected to an output terminal 4b of the preamplifier 4. The second lead pin 37 extends through the through hole 33 of the conductive base 31 from the second surface 31b side of the conductive base 31 to the first surface 31a side without being brought into contact with the conductive base 31. The distal end of the second lead pin 37 is electrically connected to an output terminal 6b of the dummy preamplifier 6. The third lead pin 38 extends through the through hole 34 of the conductive base 31 from the second surface 31b side of the conductive base 31 to the first surface 31a side without being brought into contact with the conductive base 31. The distal end of the third lead pin 38 is electrically connected to a positive voltage input terminal 9 of the preamplifier and the dummy preamplifier. The fourth lead pin 39 extends through the through hole 35 of the conductive base 31 from the second surface 31b side of the conductive base 31 to the first surface 31a side without being brought into contact with the conductive base 31. The distal end of the fourth lead pin 39 is electrically connected to the cathode 1a of the light-receiving element 1. The fifth lead pin 40 is in direct contact with the second surface 31b of the conductive base 31 and grounded.

The first to fourth lead pins are arranged at an equal interval so as to surround the fifth lead pin (ground terminal). An interval between the fifth lead pin 40 and each of the first to fourth lead pins 36 to 39 is 1.27 mm. The TO package is preferably a TO18 package.

As shown in FIGS. 4 and 7, the equivalent capacitor 5 comprises: an insulating film 62 having a first surface and a second surface opposite to the first surface; a common electrode 630 arranged on the first surface of the insulating film 62; and a plurality of isolated electrodes 63a to 63d arranged on the second surface of the insulating film 62. As shown in FIG. 8, the isolated electrodes 63a to 63d are electrically isolated from each other and have areas different from each other. Note that it is preferable that the equivalent capacitor 5 be a MIS capacitor.

The photoelectric conversion module according to the present invention further comprises a bias circuit 2 for the light-receiving element 1 between the cathode 1a of the light-receiving element 1 and a power supply terminal 3 (the power supply terminal for the light-receiving element 1 bonded to the second lead pin 37 through a wire). The bias circuit 2 consists of an RC network filter. In particular, as shown in FIGS. 1 and 9, this RC network filter comprises a MIM capacitor constituted by an insulator 52 having a first surface 52b and a second surface 52a opposite to the first surface 52b, and metal films 53 and 57 formed on the first and second surfaces 52b and 52a of the insulator 52, respectively, and a resistor 56 formed on any one of the first and second surfaces 52b and 52a of the insulator 52.

Noise identical to that of an output from the preamplifier connected to the light-receiving element is superposed on an output (noise compensation output) from the dummy preamplifier whose input terminal is connected to the equivalent capacitor having a capacitance value substantially equal to the capacitance of the light-receiving element. Therefore, a signal from which the noise is completely removed can be obtained by a differential amplifier connected to the input of an external comparator.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENT

Figure 1:
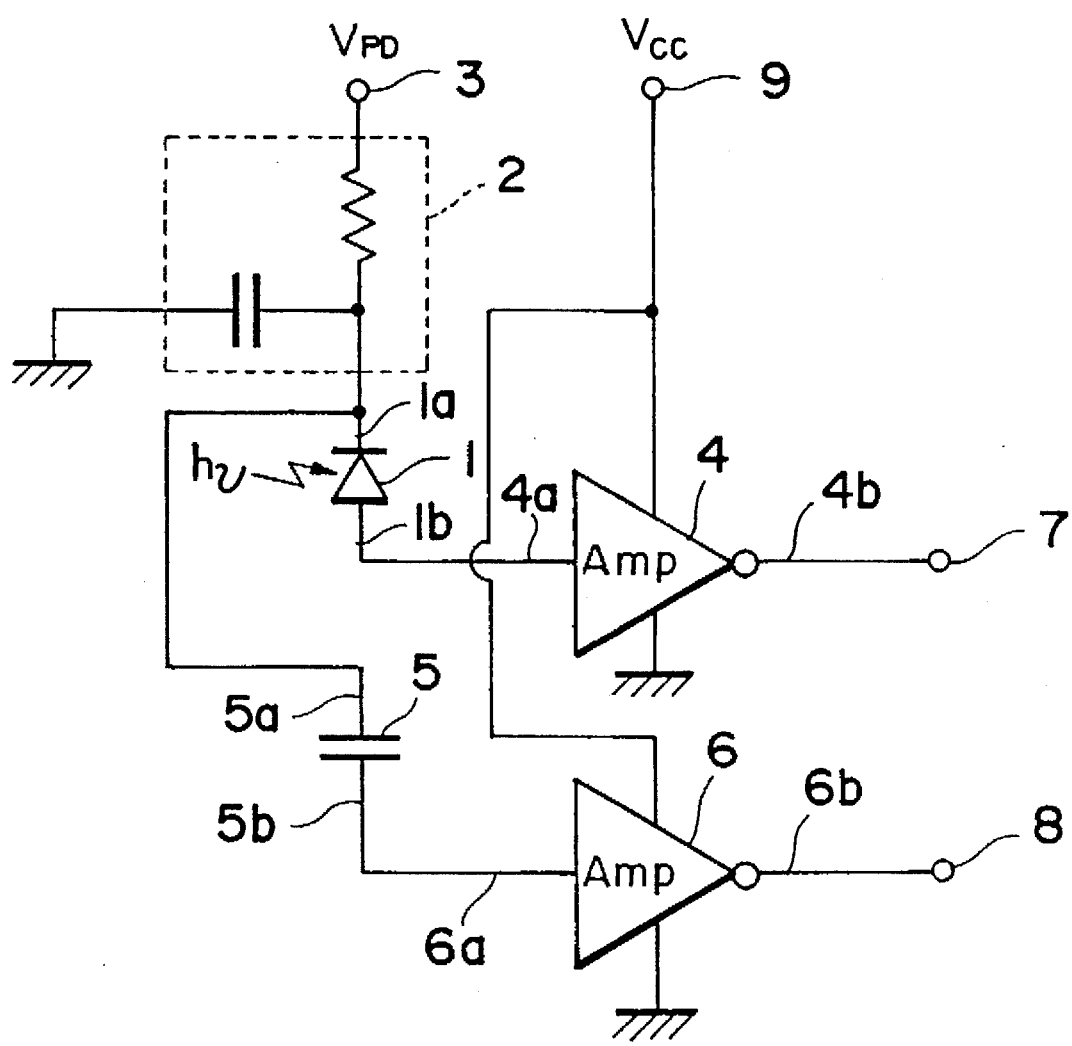
FIG. 1 is a circuit diagram showing an example of the arrangement of a circuit mounted on a TO package of a photoelectric conversion module according to the present invention.

An embodiment of a photoelectric conversion module according to the present invention will be described with reference to FIGS. 1 to 12. FIG. 1 shows a circuit mounted on a TO package (package base) of the photoelectric conversion module according to the present invention. In this circuit, a cathode 1$a$ of a photodiode 1 as a light-receiving element is connected to an input terminal 3 of a photodiode power supply $V_{PD}$ through a bias circuit 2. The bias circuit 2 consists of an RC network filter constituted by a resistor and a capacitor. An anode 1$b$ of the photodiode 1 is connected to an input terminal 4$a$ of a preamplifier 4 (first amplifier). A capacitor 5 is an equivalent capacitor having a capacitance value equal to the capacitance of the photodiode 1. One electrode 5$a$ of the capacitor 5 is connected to the cathode 1$a$ of the photodiode 1, and the other electrode 5$b$ is connected to an input terminal 6$a$ of a preamplifier 6. Although the preamplifier 6 has the same arrangement as that of the preamplifier 4, the preamplifier 6 does not amplify a signal component. For this reason, the preamplifier 6 is called a dummy preamplifier. Output terminals 4$b$ and 6$b$ of the preamplifier 4 and the dummy preamplifier 6 are connected to first and second output terminals 7 and 8, respectively. The preamplifier 4 and the dummy preamplifier 6 are driven by a power supply $V_{CC}$ different from the photodiode power supply. A power supply terminal 9 serves as a power supply $V_{CC}$ input terminal.

Figure 2:
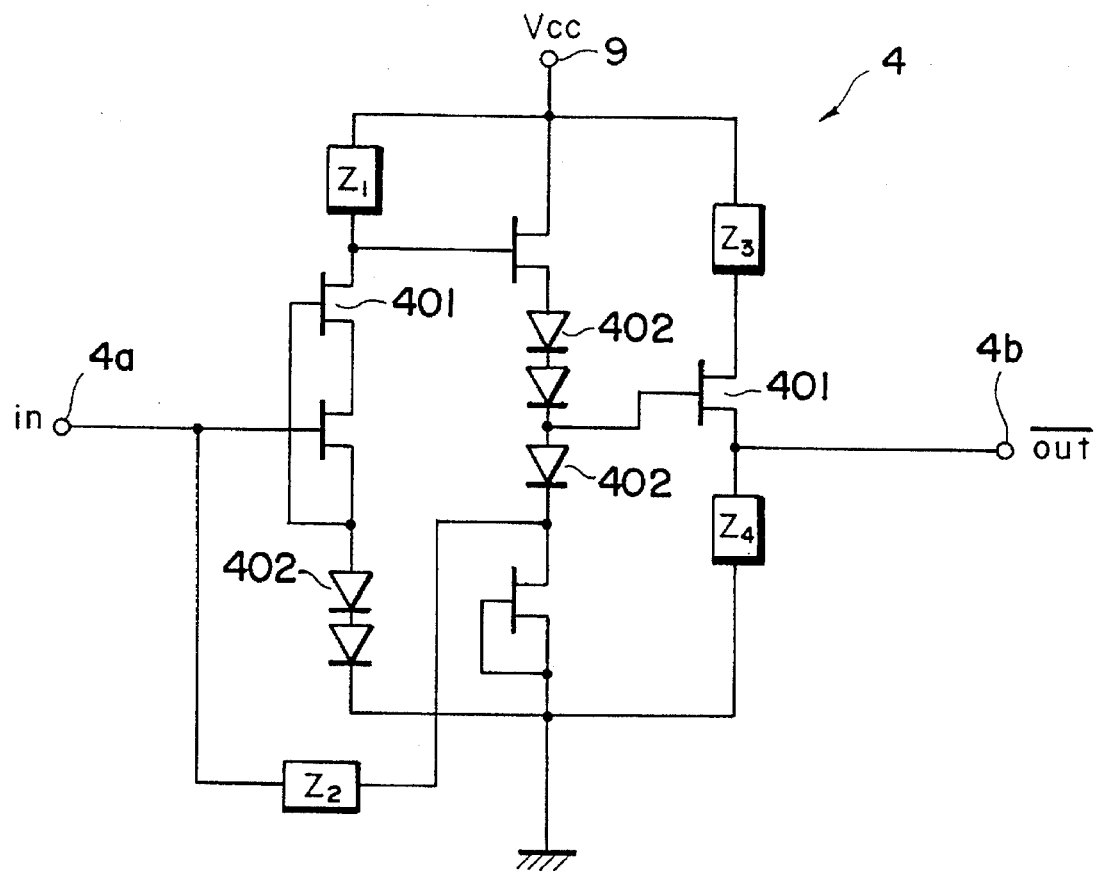
FIG. 2 is a circuit diagram showing an example of the arrangement of a preamplifier (first amplifier) and a dummy preamplifier (second amplifier) shown in FIG. 1 (the preamplifier and the dummy preamplifier have the same circuit arrangement)
Figure 3:
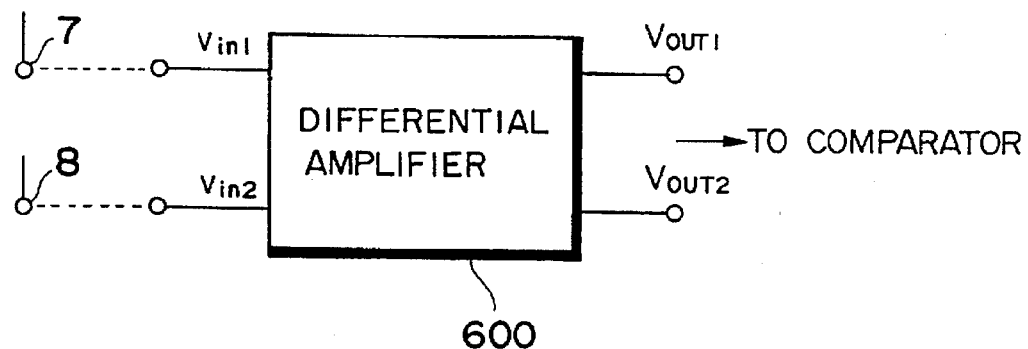
FIG. 3 is a view showing a differential amplifier electrically connected to the electrical output terminals of the circuit shown in FIG. 1.

FIG. 2 shows a general circuit arrangement of the preamplifier 4. The dummy preamplifier 6 has the same arrangement. The reason is that the dummy preamplifier 6 is not used as a preamplifier, but the dummy preamplifier 6 obtains the same output operating point as that of the preamplifier 4. Outputs from the two amplifiers having the same circuit arrangement are supplied as two inputs ($V_{in1}$ and $V_{in2}$) to an external differential amplifier 600. With this arrangement, a common mode component of differential inputs can be eliminated regardless of variations in power supply (FIG. 3). In FIG. 2, reference numeric 401 denotes a FET (field effect transistor), and reference numeric 402 denotes a level shift diode. Furthermore, in this figure, reference symbols Z1–Z4 denote impedance of the circuit.

In FIG.3, note that two outputs ($V_{OUT1}$ and $V_{OUT2}$) from the differential amplifier 600 are input to a comparator connected to the output of the differential amplifier 600. Only a signal component is extracted. The arrangement of an external circuit including the differential amplifier and the comparator is well-known.

Figure 4:
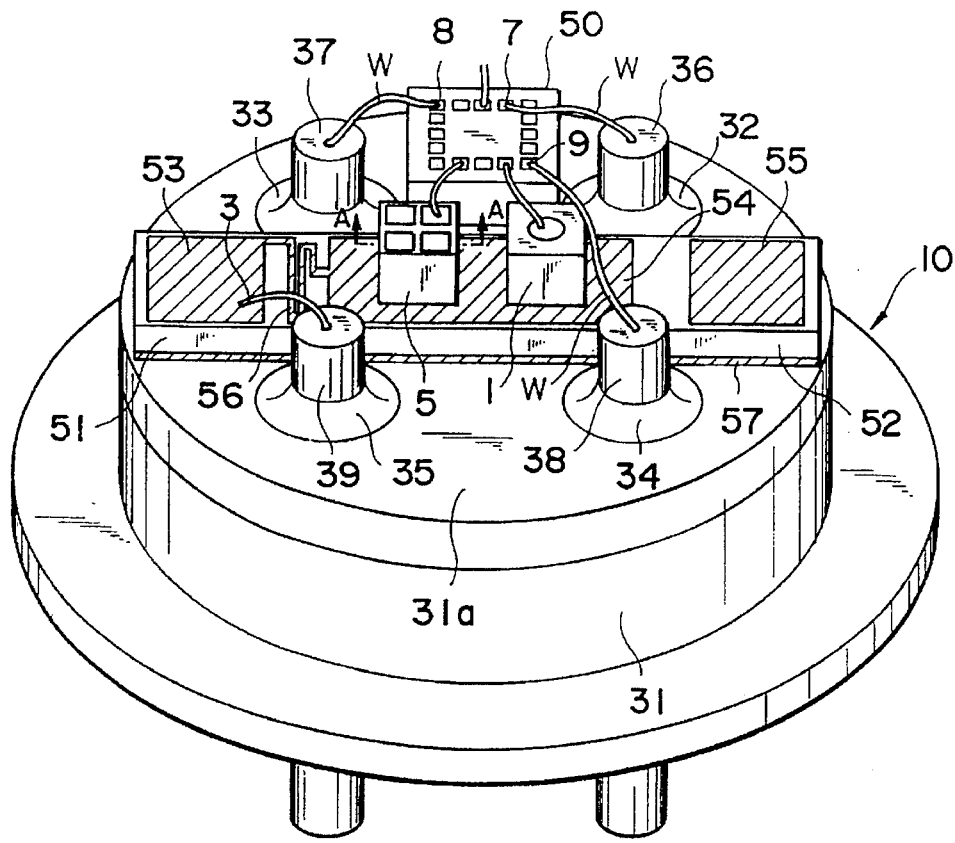
FIG. 4 is a perspective view showing the internal arrangement of the photoelectric conversion module according to the present invention.
Figure 5:
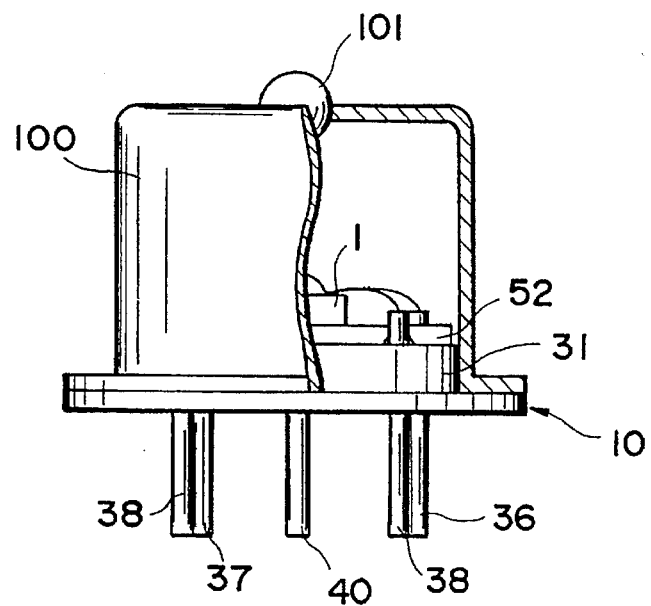
FIG. 5 is a partially sectional view showing the arrangement of the photoelectric conversion module according to the present invention.
Figure 6A:
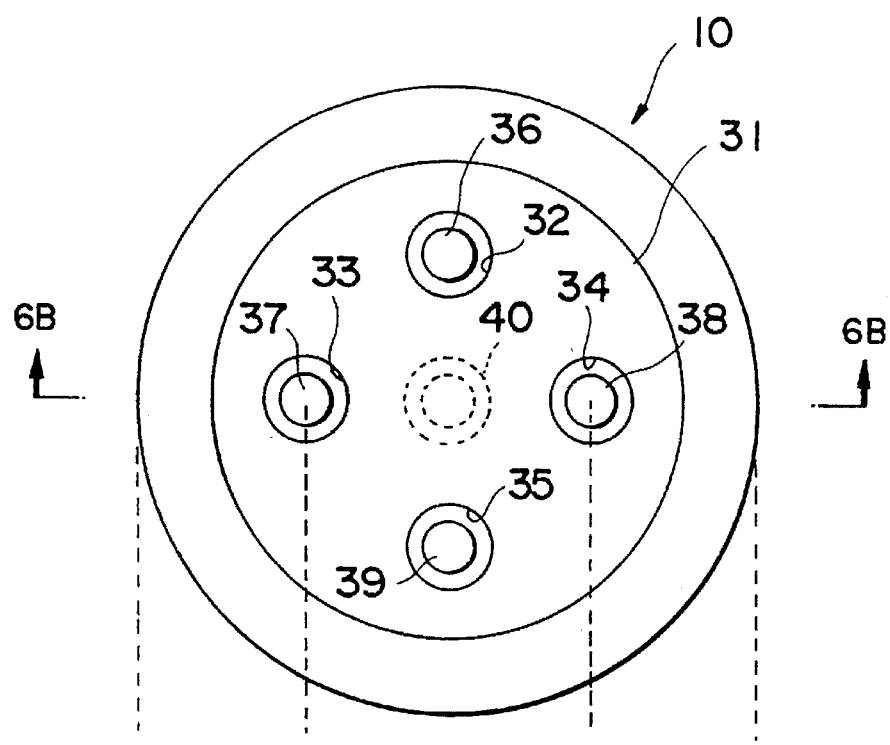
FIGS. 6A and 6B shows views of the arrangement of the TO package applied to the photoelectric conversion module shown in FIG. 4, in which the upper view is a plan view showing the upper portion of the TO package, and the lower view is a sectional view showing the TO package along the line 6B—6B in the upper view.
Figure 6B:
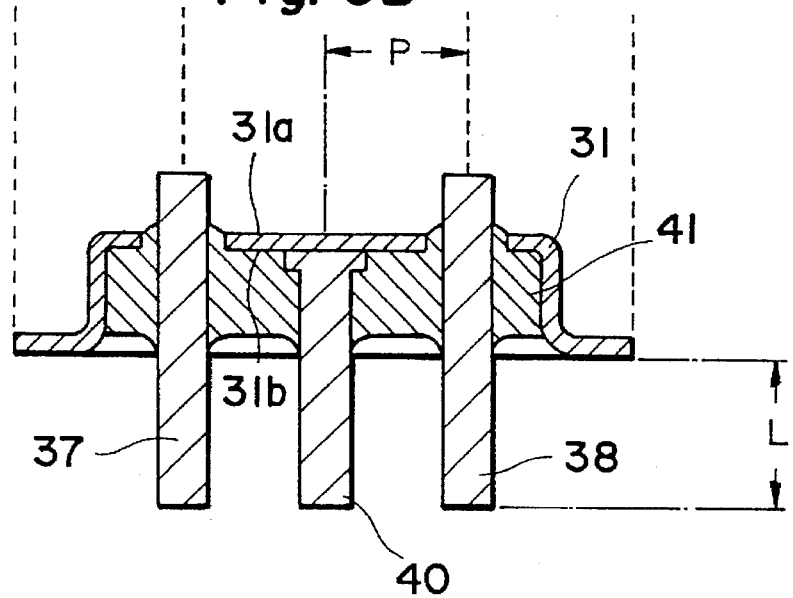

As shown in FIG. 4, the circuit having the above arrangement is entirely mounted on one TO package 10. The resultant structure constitutes a photoelectric conversion module, as shown in FIG. 5. This TO package 10 has a TO18 structure of a TO package standard. As shown in FIGS. 5, 6A, and 6B, four openings 32 to 35 are formed at an element mounting portion of a disk-like conductive base 31. Lead pins 36 to 39 are respectively fitted and fixed in the openings 32 to 35, while being insulated from the base plate 31. The TO package is filled with glass 41. The first to fourth lead pins 36 to 39 are fixed to and insulated from the base plate 31 of the TO package by this glass 41. A fifth lead pin 40 is fixed at the central portion of the second surface 31$b$ of the element mounting portion by welding. The lead pin 40 is surrounded by the lead pins 36 to 39 arranged at an equal interval. An outer lead length L of each of the lead pins 36 to 40 is 1.5 mm. A pitch P between the central lead pin 40 and each of the remaining lead pins 36 to 39 is 1.27 mm. With this arrangement, the lead pins can be easily mounted on a board, and a commercially available connector socket can be utilized, thereby easily performing a drive test.

As shown in FIG. 4, the first lead pin 36 extends through the through hole 32 of the conductive base 31 from the second surface 31b side of the conductive base 31 to the first surface 31a side without being brought into contact with the conductive base 31. The distal end of the first lead pin 36 is bonded to the terminal 7 for obtaining an output from the preamplifier 4 through a wire (reference symbol w denotes a wire in FIG. 4). The second lead pin 37 extends through the through hole 33 of the conductive base 31 from the second surface 31b side of the conductive base 31 to the first surface 31a side without being brought into contact with the conductive base 31. The distal end of the second lead pin 37 is bonded through a wire to the terminal 8 for obtaining an output from the dummy amplifier 6. The third lead pin 38 extends through the through hole 34 of the conductive base 31 from the second surface 31b side of the conductive base 31 to the first surface 31a side without being brought into contact with the conductive base 31. The distal end of the third lead pin 38 is bonded through a wire to a positive voltage input terminal 9 for applying a predetermined voltage ($V_{CC}$) to the preamplifier 4 and the dummy preamplifier 6. The fourth lead pin 39 extends through the through hole 35 of the conductive base 31 from the second surface 31b side of the conductive base 31 to the first surface 31a side without being brought into contact with the conductive base 31. The distal end of the fourth lead pin 39 is bonded through a wire to the power supply terminal 3 for applying a predetermined voltage ($V_{PD}$) to the cathode 1a of the photodiode 1. The fifth lead pin 40 is in direct contact with the second surface 31b of the conductive base 31 and grounded.

Figure 9:
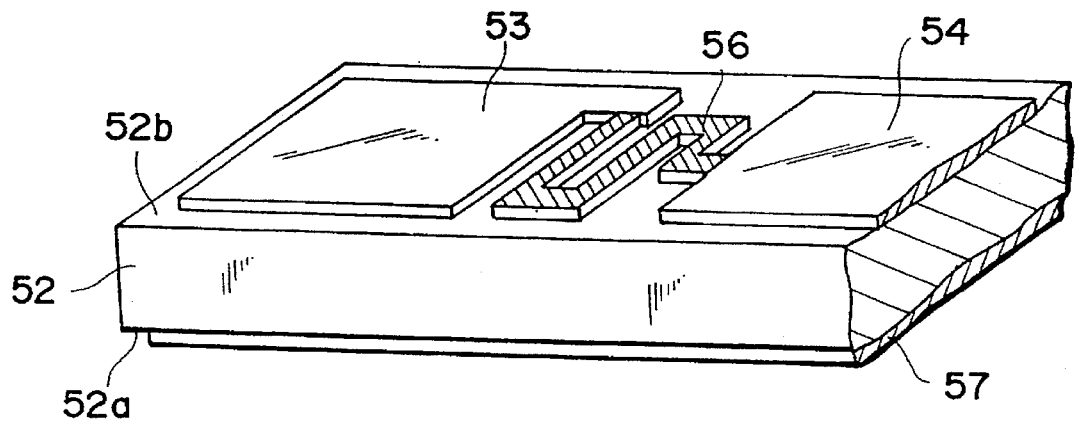
FIG. 9 is a perspective view showing the structure of a bias circuit applied to the photoelectric conversion module according to the present invention.

As shown in FIG. 4, a functional board 52 on which the photodiode 1 and the equivalent capacitor 5 are mounted, and an IC chip 50 including the preamplifier 4 and the dummy preamplifier 6 are soldered to the element mounting portion of the conductive base 31. The functional board 52 is an insulating board. A thick or thin metal film 57 is entirely formed on a second surface 52a of the functional board 52, as shown in FIG. 9. Similarly, thick or thin metal films 53, 54, and 55 are formed in three divided regions on a first surface 52b of the functional board 52.

A meandrous resistor 56 is formed between the metal films 53 and 54 by printing or the like (FIGS. 4 and 9). The resistor 56, and a capacitor constituted by the metal films 53 and 54 and the metal film (the base plate 31 in this embodiment) on the second surface constitute the bias circuit or RC network filter 2 shown in FIG. 1.

Figure 7:
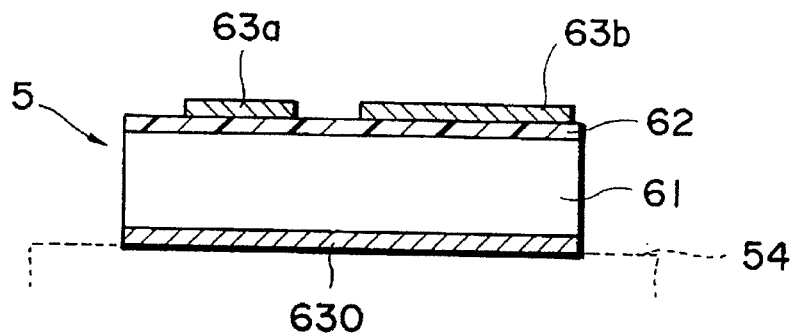
FIG. 7 is a sectional view showing the structure of an equivalent capacitor along the line A—A in FIG. 4 and the line 7C—7C in FIG. 8.
Figure 8:
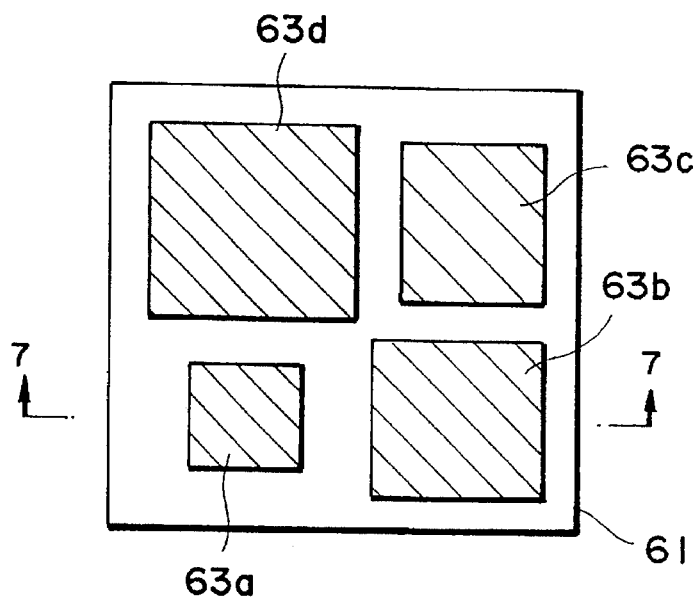
FIG. 8 is a plan view showing the upper portion of the structure of the equivalent capacitor.

The cathode 1a of the photodiode 1 and one electrode 5a of the equivalent capacitor 5 are soldered to the central metal film 54. The equivalent capacitor 5 is a compensation capacity selective MIS (Metal Insulator Semiconductor) capacitor chip. FIG. 7 shows the sectional structure of the equivalent capacitor 5. Note that FIG. 7 is a sectional view of the capacitor 5 along the line A—A in FIG. 4 and the line 7C—7C in FIG. 8. As is apparent from FIG. 7, an insulating film 62 consisting of, e.g., $SiO_2$ is formed on a heavily doped n- or p-type semiconductor substrate 61. Four metal electrodes 63a to 63d are formed on the insulating film 62 (note that only the metal electrodes 63a and 63b are illustrated in FIG. 7). As shown in FIG. 8, the four metal electrodes 63a to 63d have different areas, so that a different capacitance value can be selected by alternatively selecting any one of the four metal electrodes 63a to 63d.

The TO package 10 having such an arrangement is covered with a cap 100 having a condenser lens 101 to complete the photoelectric conversion module of this embodiment (FIG. 5). Signal light incident from the outside of the cap 100 is condensed by the condenser lens 101 and reaches the light-receiving surface of the photodiode 1. The optical signal is converted into an electrical signal and input to the preamplifier 4 formed on the IC chip 50. An output signal from the preamplifier 4 is extracted from the lead pin 36. The power supply voltage $V_{PD}$ is applied to the equivalent capacitor 5 and the photodiode 1 through the bias circuit 2. The dummy preamplifier 6 having the same circuit arrangement as that of the preamplifier 4 is formed on the single chip (see FIG. 2). Therefore, a compensation signal having DC and noise components identical with those of the output signal from the preamplifier 4 is extracted from the lead pin 37 electrically connected to the output terminal 6b of the dummy preamplifier 6. The next differential input amplifier 600 (FIG. 3) cancels the output signal from the lead pin 36 with the noise compensation signal from the lead pin 37 to completely remove the noise included in the output signal from the preamplifier 4.

Note that, it can be technically considered that a dummy photodiode having the same structure as that of the photodiode 1 is used instead of the equivalent capacitor 5. The dummy photodiode, however, is expensive. It can also be considered that the input terminal of the dummy preamplifier 6 is released without using the equivalent capacitor 5. In this case, however, a balance may be lost in an RF range.

The equivalent capacitor 5 of this embodiment is a capacity selective MIS capacitor whose capacitance can be selected from four capacitance values, as described above. This capacitor is convenient because the nearest capacitance value to that of the photodiode 1 can be selected for this capacitor in mounting even if the photodiodes 1 vary in manufacturing. Alternatively, a general MIS capacitor may be used instead of the capacity selective MIS capacitor, as a matter of course. Further, a MIM (Metal Insulation Metal) capacitor may be used in place of the MIS capacitor. An on-chip capacitor may be arranged on the IC chip 50 and defined as the equivalent capacitor 5.

Figure 10:
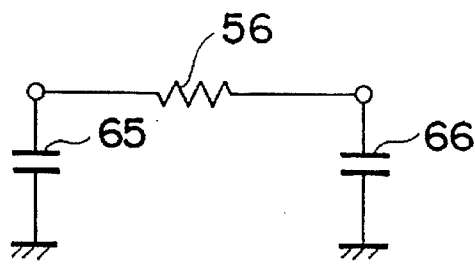
FIG. 10 is a circuit diagram showing the equivalent circuit of the bias circuit shown in FIG. 9.
Figure 11:
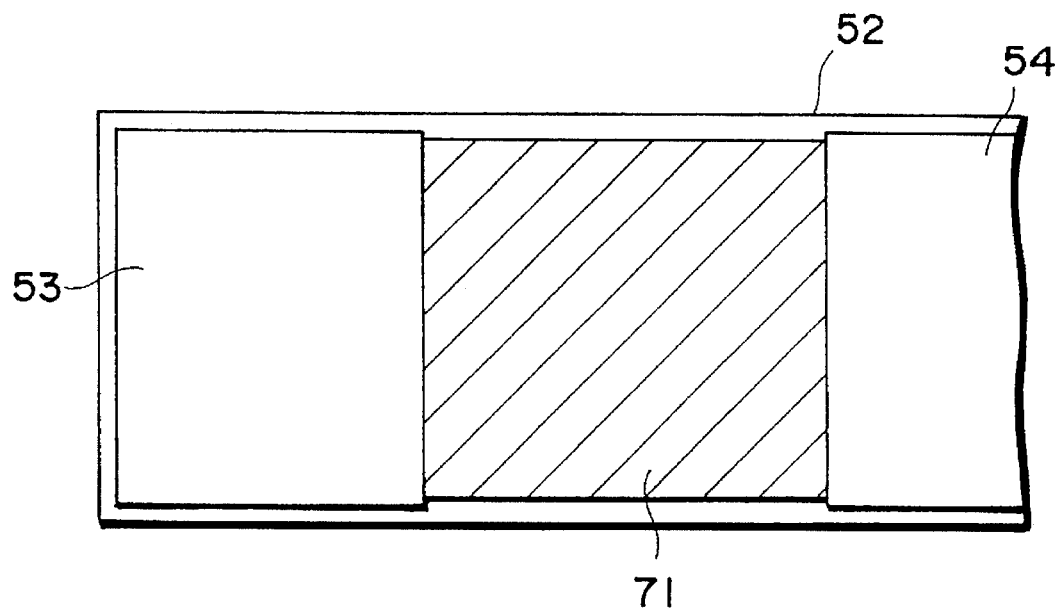
FIG. 11 is a plan view showing a distributed capacity low-pass RC network filter as another example for the bias circuit applied to the photoelectric conversion module according to the present invention.
Figure 12:
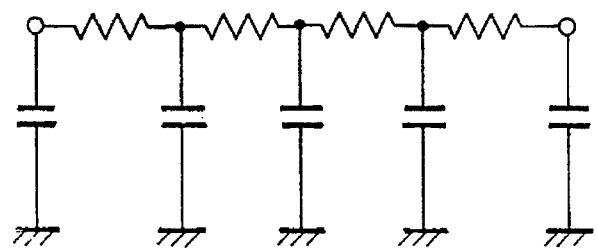
FIG. 12 is a circuit diagram showing the equivalent circuit of the bias circuit shown in FIG. 11.

The bias circuit 2 of this embodiment, whose shape and equivalent circuit are shown in FIGS. 9 and 10, consists of the RC network filter constituted by the meandrous film resistor 56 and MIM capacitors 65 and 66 using the corresponding metal films 53 and 54 as electrodes. The form of the bias circuit 2 is not limited to this, and a distributed capacity low-pass RC network filter can be used for the bias circuit 2, as shown in FIG. 11. FIG. 12 shows the equivalent circuit of this distributed capacity low-pass filter. In FIG. 11, reference numeral 71 denotes a film resistor, and the remaining elements are the same as in FIG. 9. The bias circuit 2 of any one of the types shown in FIGS. 9 and 11 can have an arrangement smaller than that of a bias circuit using a dye cap and a wiring resistor.

As has been described above, according to the present invention, the light-receiving element for converting an optical signal into an electrical signal, the preamplifier for amplifying an output signal from this light-receiving element, the dummy preamplifier having the same arrangement as that of the preamplifier, and the equivalent capacitor having one terminal connected to the input terminal of this dummy preamplifier and a capacitance value equal to the capacitance of the light-receiving element are mounted on the TO package. With this structure, the photoelectric conversion module in which a noise compensation output can be obtained in addition to a signal output can be supplied at low cost.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 273555/1994 (6-273555) filed on Nov. 8, 1994, is hereby incorporated by reference.

What is claimed is:

1. A photoelectric conversion module comprising:

a conductive base having a first surface, a second surface opposite to said first surface, and a plurality of through holes extending from said first surface to said second surface;

a light-receiving element, provided on said first surface of said conductive base, for converting an optical signal into an electrical signal, said light-receiving element having a cathode electrically connected to a power supply terminal set at a predetermined potential, and an anode;

a first amplifier provided on said first surface of said conductive base and having an input terminal electrically connected to said anode of said light-receiving element;

a capacitor provided on said first surface of said conductive base and having a first electrode electrically connected to said cathode of said light-receiving element, said capacitor having a capacitance value substantially equal to a capacitance of said light-receiving element; and a second amplifier provided on said first surface of said conductive base and having a same circuit arrangement as said first amplifier, said second amplifier having an input terminal electrically connected to a second electrode of said capacitor.

2. A module according to claim 1, wherein said capacitor comprises:

an insulating film having a first surface and a second surface opposite to said first surface;

a common electrode arranged on said first surface of said insulating film; and a plurality of isolated electrodes arranged on said second surface of said insulating film, said isolated electrodes being electrically isolated from each other and having areas different from each other.

3. A module according to claim 1, wherein said capacitor is a MIS capacitor.

4. A module according to claim 1, further comprising:

a first lead pin extending through one of the through holes of said conductive base from said second surface of said conductive base to said first surface of said conductive base without being brought into contact with said conductive base, said first lead pin having a distal end electrically connected to an output terminal of said first amplifier;

a second lead pin extending through one of the through holes of said conductive base from said second surface of said conductive base to said first surface of said conductive base without being brought into contact with said conductive base, said second lead pin having a distal end electrically connected to an output terminal of said second amplifier;

a third lead pin extending through one of the through holes of said conductive base from said second surface of said conductive base to said first surface of conductive base without being brought into contact with said conductive base, said third lead pin having a distal end electrically connected to a positive voltage input terminal of said first and second amplifiers;

a fourth lead pin extending through one of the through holes of said conductive base from said second surface of said conductive base to said first surface of said conductive base without being brought into contact with said conductive base, said fourth lead pin having a distal end electrically connected to said power supply terminal; and a fifth lead pin in direct contact with said second surface of said conductive base.

5. A module according to claim 4, wherein said fifth lead pin is a ground terminal.

6. A module according to claim 4, wherein said first to fourth lead pins are arranged at an equal interval so as to surround said fifth lead pin.

7. A module according to claim 6, wherein an interval between said fifth lead pin and each of said first to fourth lead pins is 1.27 mm.

8. A module according to claim 1, further comprising a bias circuit for said light-receiving element between said cathode of said light-receiving element and said power supply terminal, said bias circuit consisting of an RC network filter.

9. A module according to claim 8, wherein said RC network filter comprises:

a MIM capacitor constituted by an insulator having a first surface and a second surface opposite to said first surface, and metal films formed on said first and second surfaces of said insulator, respectively; and a resistor formed on any one of said first and second surfaces of said insulator.

10. A photoelectric conversion module, comprising:

a package base having a conductive base, said conductive base having a first surface, a second surface opposite to said first surface, and a plurality of through holes extending from said first surface to said second surface;

a light-receiving element, provide on said first surface of said conductive base, for converting an optical signal into an electrical signal, said light-receiving element having a cathode set at a predetermined potential, and an anode;

a first amplifier provided on said first surface of said conductive base and having an input terminal electrically connected to said anode of said light-receiving element;

a capacitor provided on said first surface of said conductive base and having a first electrode electrically connected to said cathode of said light-receiving element, said capacitor having a capacitance value substantially equal to a capacitance of said light-receiving element;

a second amplifier provided on said first surface of said conductive base and having the same circuit arrangement as that of said first amplifier, said second amplifier having an input terminal electrically connected to a second electrode of said capacitor;

a first lead pin extending through one of the through holes of said conductive base from said second surface of said conductive base to said first surface of said conductive base without being brought into contact with said conductive base, said first lead pin having a distal end electrically connected to an output terminal of said first amplifier;

a second lead pin extending through one of the through holes of said conductive base from said second surface of said conductive base to said first surface of said conductive base without being brought into contact with said conductive base, said second lead pin having a distal end electrically connected to an output terminal of said second amplifier;

a third lead pin extending through one of the through holes of said conductive base from said second surface of said conductive base to said first surface of said conductive base without being brought into contact with said conductive base, said third lead pin having a distal end electrically connected to a positive voltage input terminal of said first and second amplifiers;

a fourth lead pin extending through one of the through holes of said conductive base from said second surface of said conductive base to said first surface of said conductive base without being brought into contact with said conductive base, said fourth lead pin having a distal end electrically connected to said cathode of said light-receiving element; and a fifth lead pin in direct contact with said second surface of said conductive base.

11. A module according claim 10, further comprising a bias circuit for said light-receiving element, said bias circuit disposed between said cathode of said light-receiving element and said fourth lead pin, and consisting of an RC network filter.

12. A module according to claim 10, wherein said first to fourth lead pins are arranged at an equal interval so as to surround said fifth lead pin.

13. A module according to claim 10, wherein said fifth lead pin is a ground terminal.

* * * * *